(12) United States Patent
Lidow et al.

(10) Patent No.: US 8,823,012 B2
(45) Date of Patent: Sep. 2, 2014

(54) ENHANCEMENT MODE GAN HEMT DEVICE WITH GATE SPACER AND METHOD FOR FABRICATING THE SAME

(75) Inventors: Alexander Lidow, Marina Del Ray, CA (US); Robert Beach, La Crescenta, CA (US); Alana Nakata, Redondo Beach, CA (US); Jianjun Cao, Torrance, CA (US); Guang Yuan Zhao, Torrance, CA (US); Robert Strittmatter, La Canada, CA (US); Fang Chang Liu, Taiwan (TW)

(73) Assignee: Efficient Power Conversion Corporation, El Segundo, CA (US)

( * ) Notice: Subject to any disclaimer, the term of this patent is extended or adjusted under 35 U.S.C. 154(b) by 171 days.

(21) Appl. No.: 13/403,400

(22) Filed: Feb. 23, 2012

(65) Prior Publication Data

US 2012/0175631 A1    Jul. 12, 2012

Related U.S. Application Data

(63) Continuation-in-part of application No. 12/756,960, filed on Apr. 8, 2010, now Pat. No. 8,404,508.

(60) Provisional application No. 61/167,777, filed on Apr. 8, 2009.

(51) Int. Cl.
  *H01L 21/48* (2006.01)
  *H01L 21/02* (2006.01)
  *H01L 29/20* (2006.01)
  *H01L 33/00* (2010.01)

(52) U.S. Cl.
  CPC ........ *H01L 21/0254* (2013.01); *H01L 29/2003* (2013.01); *H01L 33/007* (2013.01)
  USPC ............. 257/76; 257/192; 257/196; 257/213; 257/E21.333; 257/E21.403; 257/E29.246; 257/E29.315; 257/E31.001

(58) Field of Classification Search
  CPC ............ H01L 21/0254; H01L 29/2003; H01L 33/007
  USPC .................... 257/76, 192–196, 213, E21.333, 257/403–409, 29.242–246, 315, 31.001
  See application file for complete search history.

(56) References Cited

U.S. PATENT DOCUMENTS

| 5,474,976 A | 12/1995 | Kondoh et al. |
| 6,001,716 A | 12/1999 | Liao |

(Continued)

FOREIGN PATENT DOCUMENTS

| KR | 10-2011-0067512 A | 6/2011 |
| KR | 10-2011-0137809 A | 12/2011 |

OTHER PUBLICATIONS

X. Hu, et al. "Enhancement Mode AlGaN/GaN HFET With Selectively Grown pn Junction Gate", *Electronics Letters*, vol. 35, No. 8, pp. 753-754, Apr. 13, 2000.

(Continued)

*Primary Examiner* — Michael Lebentritt
(74) *Attorney, Agent, or Firm* — Dickstein Shapiro LLP

(57) ABSTRACT

Enhancement-mode GaN devices having a gate spacer, a gate metal material and a gate compound that are self-aligned, and a methods of forming the same. The materials are patterned and etched using a single photo mask, which reduces manufacturing costs. An interface of the gate spacer and the gate compound has lower leakage than the interface of a dielectric film and the gate compound, thereby reducing gate leakage. In addition, an ohmic contact metal layer is used as a field plate to relieve the electric field at a doped III-V gate compound corner towards the drain contact, which leads to lower gate leakage current and improved gate reliability.

11 Claims, 21 Drawing Sheets

(56) References Cited

U.S. PATENT DOCUMENTS

| | | |
|---|---|---|
| 6,537,838 B2 | 3/2003 | Stockman |
| 6,833,161 B2 | 12/2004 | Wang et al. |
| 7,470,941 B2 | 12/2008 | Micovic et al. |
| 7,898,002 B2 | 3/2011 | Hikita et al. |
| 7,932,539 B2 * | 4/2011 | Chen et al. ............ 257/194 |
| 8,350,294 B2 * | 1/2013 | Lidow et al. ............ 257/192 |
| 8,404,508 B2 * | 3/2013 | Lidow et al. ............ 438/46 |
| 2004/0056304 A1 | 3/2004 | Ahmed et al. |
| 2005/0051796 A1 * | 3/2005 | Parikh et al. ............ 257/192 |
| 2006/0192218 A1 | 8/2006 | Kyono et al. |
| 2006/0273347 A1 | 12/2006 | Hikita et al. |
| 2007/0228416 A1 * | 10/2007 | Chen et al. ............ 257/192 |
| 2007/0254418 A1 | 11/2007 | Sheppard et al. |
| 2007/0278518 A1 * | 12/2007 | Chen et al. ............ 257/192 |
| 2008/0116492 A1 * | 5/2008 | Wu et al. ............ 257/213 |
| 2008/0258150 A1 * | 10/2008 | McCarthy et al. ............ 257/76 |
| 2008/0303033 A1 * | 12/2008 | Brandes ............ 257/76 |
| 2009/0072272 A1 * | 3/2009 | Suh et al. ............ 257/194 |
| 2009/0267114 A1 * | 10/2009 | Nakayama et al. ............ 257/192 |
| 2010/0244041 A1 * | 9/2010 | Oishi et al. ............ 257/76 |
| 2010/0258843 A1 | 10/2010 | Lidow et al. |
| 2010/0264461 A1 * | 10/2010 | Rajan et al. ............ 257/194 |
| 2013/0214287 A1 * | 8/2013 | Okamoto et al. ............ 257/76 |

OTHER PUBLICATIONS

T. Fuji et al. "High On/Off Ratio in Enhancement-Mode $Al_xGax_{1-N}$/GaN Junction Heterostructure Field-Effect Transistors with P-Type GaN Gate Contact", *Japanese Journal of Applied Physics*, vol. 45, No. 39, pp. L1048-L1050, 2006.

Y. Uemoto et al. Gate Injection Transistor (GIT)—A Normally-Off AlGaN/GaN Power Transistor Using Conductivity Modulation, *IEEE Transactions on Electron Devices*, vol. 54, No. 12, pp. 3393-3399, Dec. 2007.

W. Saito, et al. "High Breakdown Voltage AlGaN-GaN Power-HEMT Design and High Current Density Switching Behavior", *IEEE Transactions on Electron Devices*, vol. 50, No. 12, pp. 2528-2531, Dec. 2003.

\* cited by examiner

ENHANCEMENT MODE GAN HEMT DEVICE WITH GATE SPACER AND METHOD FOR FABRICATING THE SAME

This is a continuation-in-part of application Ser. No. 12/756,960, filed on Apr. 8, 2010 now U.S. Pat. No. 8,404,508, which claims the benefit of U.S. Provisional Application Ser. No. 61/167,777, filed on Apr. 8, 2009, the disclosures of which are hereby incorporated by reference.

FIELD OF THE INVENTION

The present invention relates to the field of enhancement mode gallium nitride (GaN) high electron mobility transistor (HEMT) devices. In particular, the invention relates to a method and apparatus for providing an enhancement type HEMT device with a gate spacer.

BACKGROUND OF THE INVENTION

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET).

A GaN HEMT device includes a nitride semiconductor with at least two nitride layers. Different materials formed on the semiconductor or on a buffer layer cause the layers to have different band gaps. The different material in the adjacent nitride layers also causes polarization, which contributes to a conductive two dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, most nitride devices are normally on, or depletion mode devices. If the 2DEG region is depleted, i.e. removed, below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

In conventional enhancement mode GaN transistors, the gate metal and the p-type GaN material or p-type AlGaN material are defined by using separate photo masks. For example, FIG. 1 (prior art) shows the gate metal and gate pGaN were processed with two different photo masks. FIG. 1 illustrates a conventional enhancement mode GaN transistor device 100 which includes substrate 101 which can be either sapphire or silicon, transition layers 102, un-doped GaN material 103, un-doped AlGaN material 104, source ohmic contact metal 109, drain ohmic contact metal 110, p-type AlGaN or p-type GaN material 105, heavily doped p-type GaN material 106, and gate metal 111.

As shown in FIG. 1, the gate metal, p-type GaN, or p-type AlGaN material are defined by two separate photo masks. The first mask is used to form the p-type GaN or p-type AlGaN, either by patterning a hard mask and selectively growing the p-type GaN or by patterning and etching the p-type GaN. The second mask is used to form the gate metal either by patterning and lifting off the gate metal or by patterning and etching the gate metal. The two mask process leads to wider gate length than photo/etch minimum CD. This causes high gate charge, wider cell pitch, and higher Rdson ("on resistance"). The conventional method of fabrication also increases manufacturing costs. Another disadvantage is that the highest electric field is located at the p-type GaN material or p-type AlGaN material gate corner toward the drain ohmic contact metal. This high electric field leads to high gate leakage current and a gate reliability risk.

It would be desirable to provide an enhancement mode GaN transistor structure with a self-aligned gate which avoids the above-mentioned disadvantages of the prior art. It would also be desirable to provide a feature to relieve the high electric field at the gate corner of the p-type GaN or AlGaN.

SUMMARY

Embodiments disclosed herein relate to enhancement-mode GaN transistors having a gate spacer, a gate metal material and a gate compound that are self-aligned, and a methods of forming the same. The materials are patterned and etched using a single photo mask, which reduces manufacturing costs. An interface of the gate spacer and the gate compound has lower leakage than the interface of a dielectric film and the gate compound, thereby reducing gate leakage. In addition, an ohmic contact metal layer is used as a field plate to relieve the electric field at a doped III-V gate compound corner towards the drain contact, which leads to lower gate leakage current and improved gate reliability.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made.

The present invention is an enhancement mode GaN HEMT device having a gate spacer, a gate metal material and a gate compound that are self-aligned, and a method for making such a device. The materials are patterned and etched using a single photo mask, which reduces manufacturing costs. Furthermore, an interface of the gate spacer 21 and the gate compound has lower leakage than the interface of a dielectric film and the gate compound, thereby reducing gate leakage. In addition, an ohmic contact metal layer is used as a field plate to relieve the electric field at a doped III-V gate compound corner towards the drain contact, which leads to lower gate leakage current and improved gate reliability. The field plate at the source potential shields the gate from the drain bias. Gate drain charge (Qgd) is reduced.

Referring to FIGS. 2 and 3A-3H, a first embodiment is now described for forming an enhancement mode GaN HEMT device with a gate spacer and a self-aligned gate, wherein like reference numbers are used consistently for like features throughout the drawings.

Figure 1:
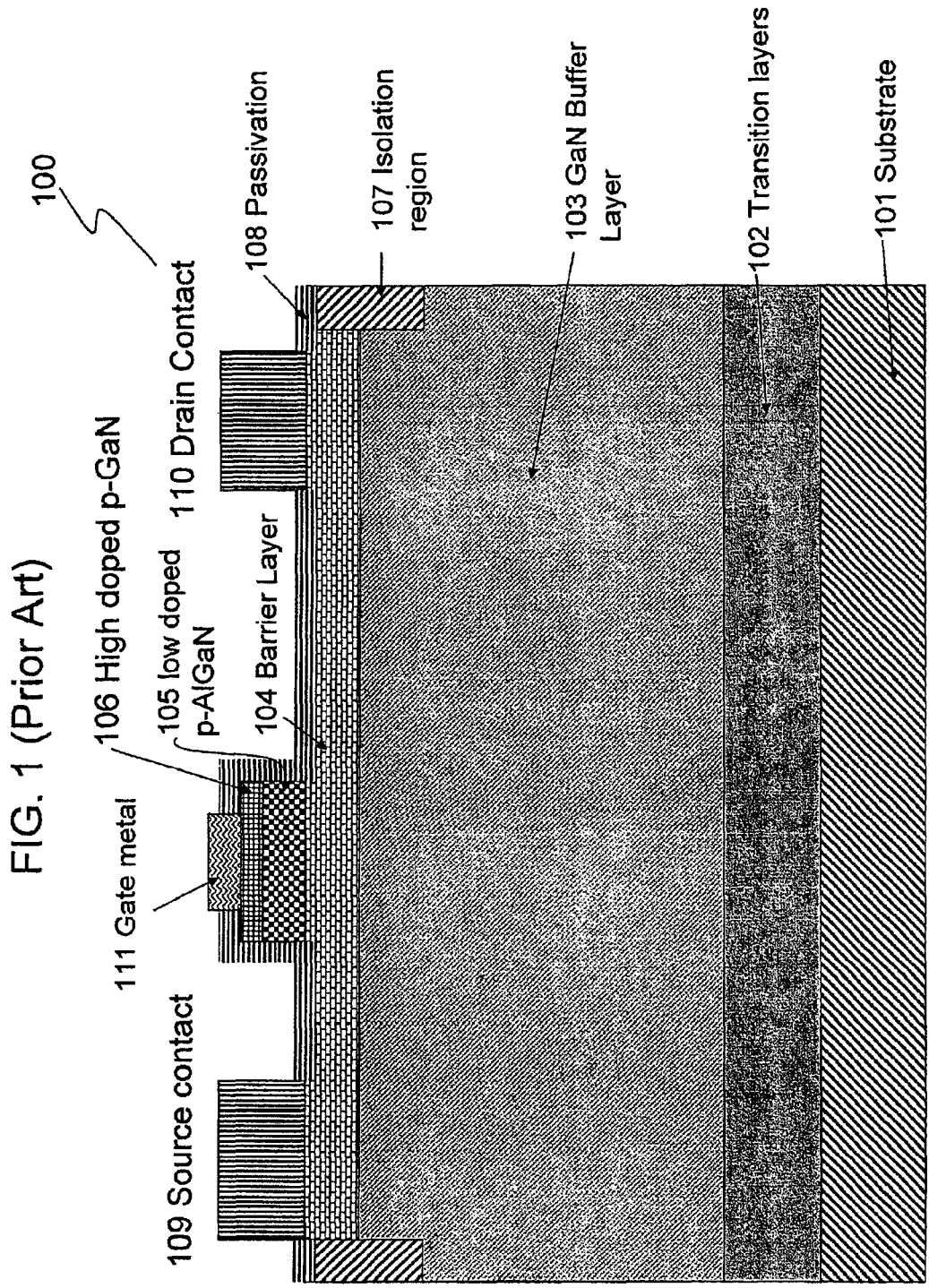
FIG. 1 illustrates a cross-sectional view of a conventional enhancement mode GaN transistor.
Figure 2:
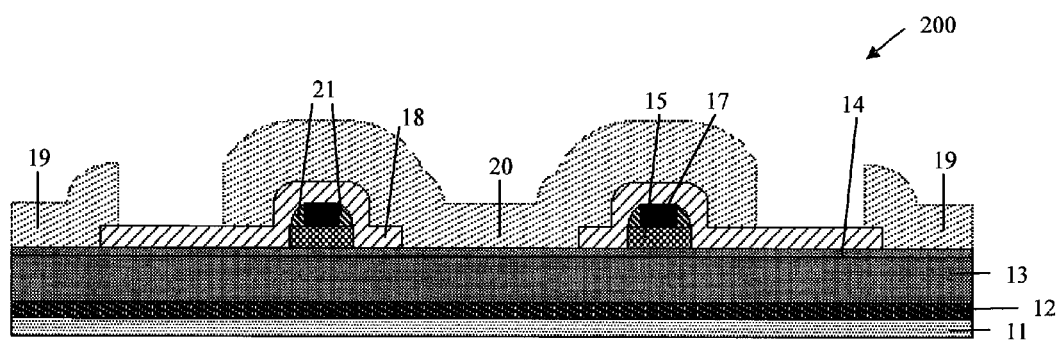
FIG. 2 illustrates an enhancement mode GaN HEMT device with a gate spacer formed according to a first embodiment of the present invention described herein.

FIG. 2 illustrates an enhancement mode GaN HEMT device 200 formed by the method described below with respect to FIGS. 3A-3H, which has a gate metal 17 and III-V gate compound 15 that are self-aligned. Device 200 includes a silicon substrate 11, a buffer material 12, an un-doped GaN buffer material 13, an un-doped AlGaN barrier material 14, the III-V gate compound 15, the gate metal 17, a dielectric material 18, a drain ohmic contact 19, a source ohmic contact 20 and a dielectric spacer 21. The source metal 20 also serves as a field plate that extends over the gate and toward the drain contact.

Figure 3A:
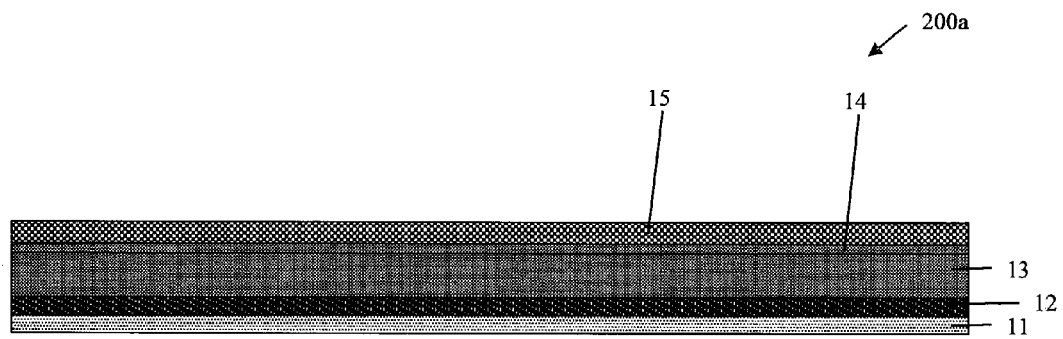
FIGS. 3A-3H schematically illustrate the formation of the enhancement mode GaN HEMT device according to the first embodiment of the present invention.

FIG. 3A illustrates the EPI structure of the GaN HEMT device 200a, including, from bottom up, the silicon substrate 11, buffer material 12, un-doped GaN buffer material 13, un-doped AlGaN barrier material 14, and the III-V gate compound material 15. The un-doped GaN buffer material 13 preferably has a thickness of about 0.5 to about 5 μm. The un-doped AlGaN barrier material 14 preferably has a thickness of about 50 Å to about 300 Å. The un-doped AlGaN barrier material 14 includes Al from about 12% to about 28% of the metallic content of the AlGaN material. The III-V gate compound 15 may have a thickness of about 500 Å to about 2000 Å. Additionally, the III-V gate compound 15 may have a p-type doping concentration between about $10^{18}$ to about $10^{20}$ atoms per $cm^3$.

Figure 3B:
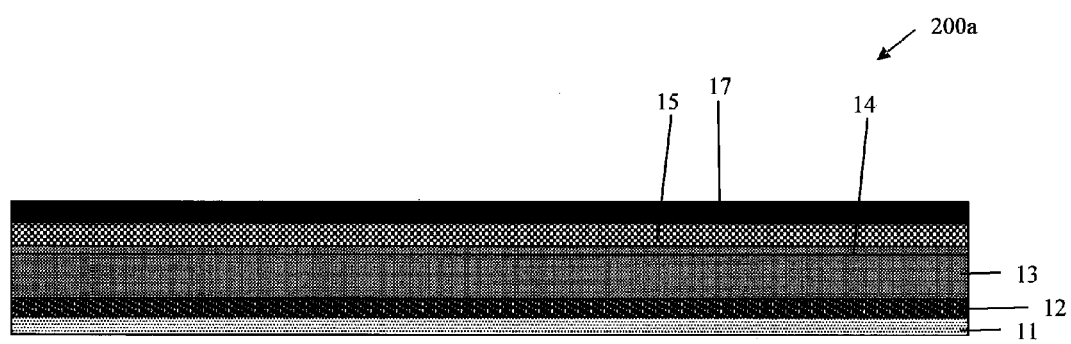

As shown in FIG. 3B, a gate metal 17 is deposited on the EPI structure shown in FIG. 3A. The gate metal 17, alternatively, can be grown at the end of EPI the above described growth. Gate metal 17 can be made of a refractory metal or its compound, e.g., tantalum (Ta), tantalum nitride (TaN), titanium nitride (TiN), palladium (Pd), tungsten (W), or tungsten silicide ($WSi_2$).

Subsequently, a single photo mask is used to pattern and etch the gate metal 17, resulting in stacks and the structure shown in FIG. 3C. The gate metal 17 is etched by any known technique, e.g., plasma etching, followed by a photoresist strip.

Figure 3C:
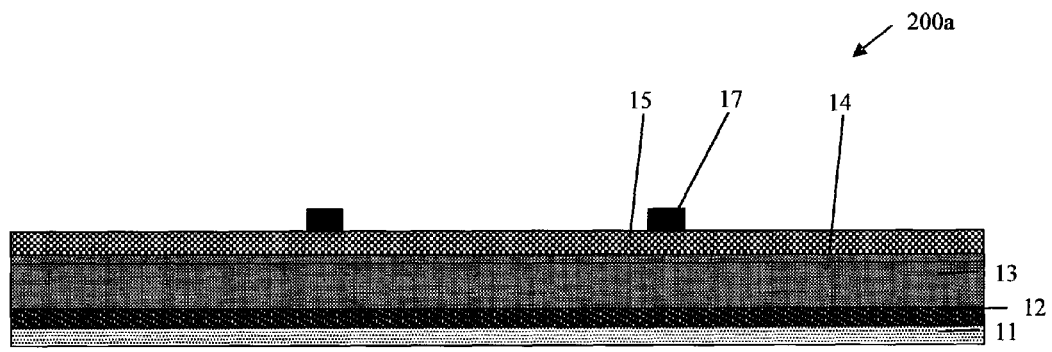
Figure 3D:
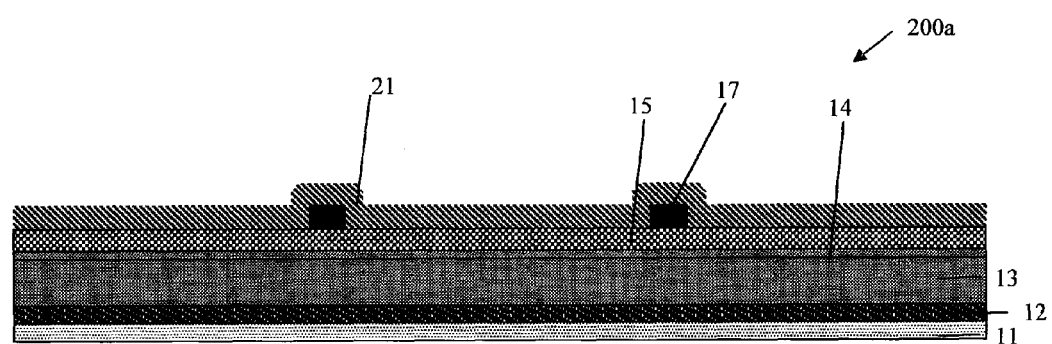
Figure 3E:
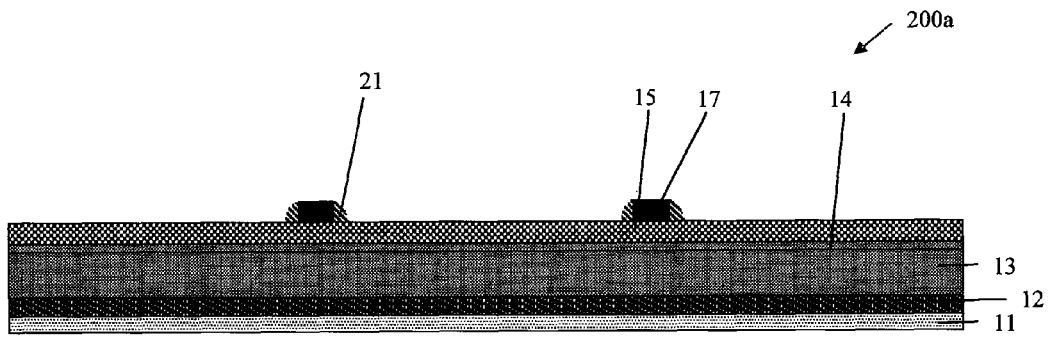

Referring now to FIG. 3D, dielectric material 21, such as silicon oxide ($SiO_2$) or plasma-enhanced chemical vapor deposition (PECVD) silicon nitride ($Si3N4$), is now deposited over the FIG. 3C structure. After deposition of the dielectric material 21, an etch back process is performed to pattern and etch the dielectric material 21, resulting in spacers 21 on the sidewalls of the gate metal 17 (shown in FIG. 3E).

Figure 3F:
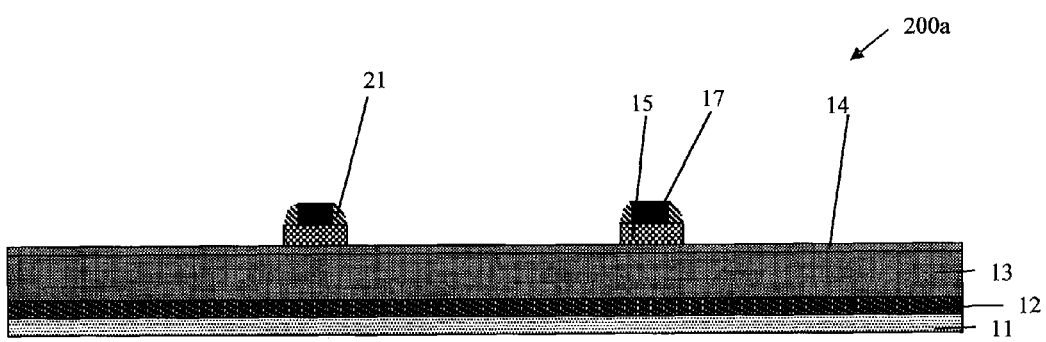

Referring now to FIG. 3F, etching of the III-V gate compound 15 is performed using the gate metal 17 and the spacers 21 as a hard mask. A dielectric material 18 such as e.g., si3N4 is then deposited over the FIG. 3F structure. After the deposition of the dielectric material 18, the material 18 is etched using a contact photo mask, followed by a photoresist strip, to form the structure illustrated in FIG. 3G.

Figure 3G:
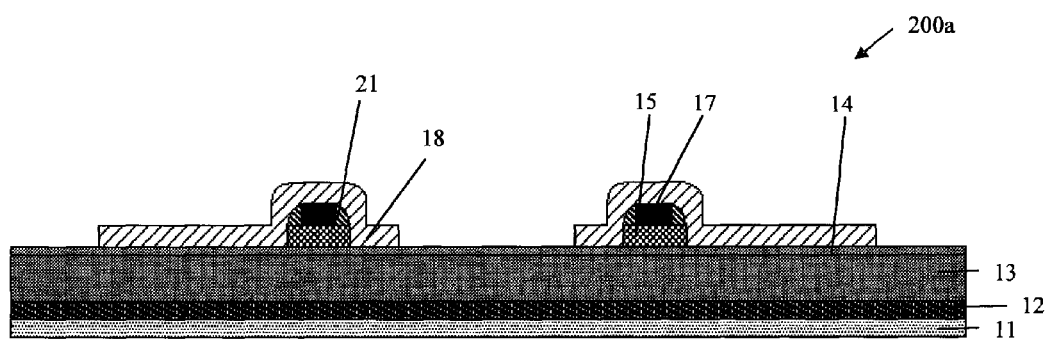
Figure 3H:
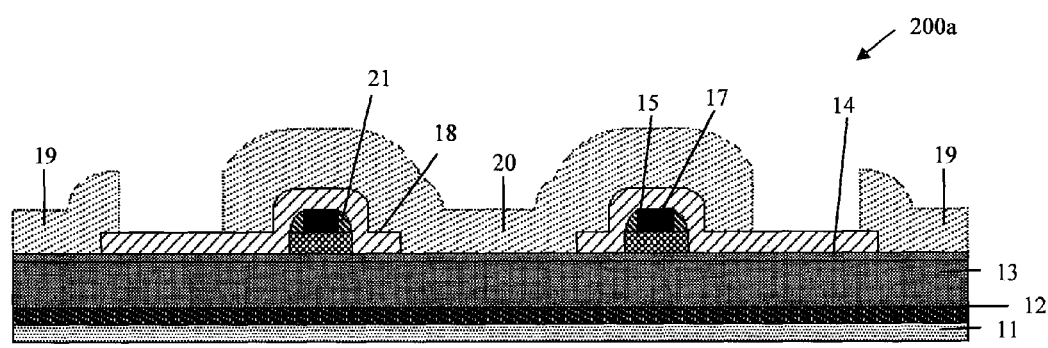

An ohmic contact metal is deposited over the FIG. 3G structure. Ohmic contact metal can be made of titanium (Ti), aluminum (Al), and a capping metal stack. After the ohmic metal deposition, a metal mask is used to pattern and etch the ohmic contact metal, resulting in the drain ohmic contact 19 and the source ohmic contact 20, as shown in FIG. 3H. Rapid thermal anneal (RTA) is performed to form ohmic contacts to AlGaN/GaN 2DEG. The source ohmic contact metal 20 is provided over the gate and acts as a field plate. It reduces the electric field at the corner of the III-V gate compound 15 corner closest to the drain ohmic contact 19.

In accordance with the above-described method, gate metal 17 is patterned and etched. A dielectric spacer 21 is then formed on the sidewalls of the gate metal 17. The III-V gate compound 15 is then etched using the gate metal 17 and the spacer 21 as a hard mask. Gate metal 17, spacer 21, and gate compound 15 are formed after a single photo mask, and thus automatically self aligned. Ohmic contact metal 19 and 20 are made of Ti, Al, and a capping metal stack. Source metal 20 goes over the gate and acts as a field plate. It reduces the electric field at the corner of the gate toward drain. Because the source ohmic contact metal 20 is used as a field plate to relieve the electric field at the III-V gate corner toward the drain ohmic contact 19, lower gate leakage current and improved gate reliability are achieved. In addition, the field plate at source potential shields the gate from the drain bias, such that gate-drain charge ($Q_{gd}$) is reduced.

Figure 4:
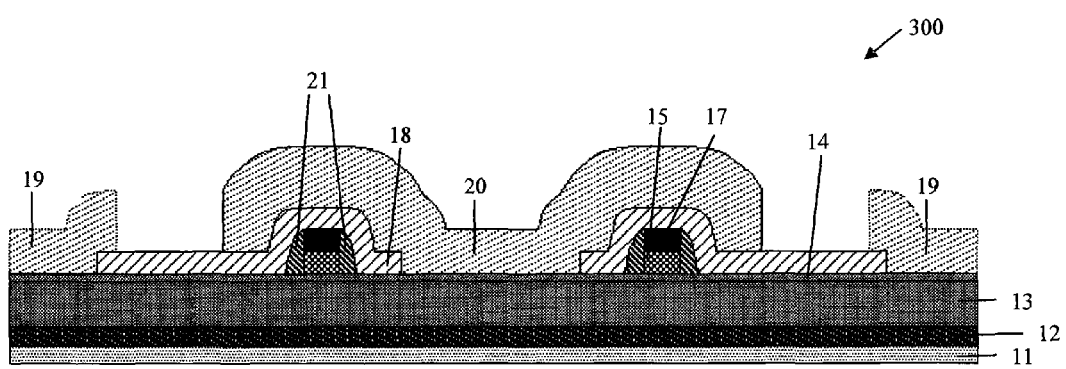
FIG. 4 illustrates an enhancement mode GaN HEMT device with a gate spacer formed according to a second embodiment of the present invention.

Referring to FIGS. 4 and 5A-5G, a second embodiment of the invention is now described. FIG. 4 illustrates an enhancement mode GaN HEMT device 300 having a gate spacer 21 formed by the method shown in FIGS. 5A-5G. The resulting device 300 will have a gate metal 17 and gate compound 15 that are self-aligned. Device 300 in FIG. 4 differs from device 200 of FIG. 2 in that device 300 includes spacers 21 that are formed not only on the sidewalls of the gate metal 17, but also on the sidewalls of the III-V gate compound 15.

Figure 5A:
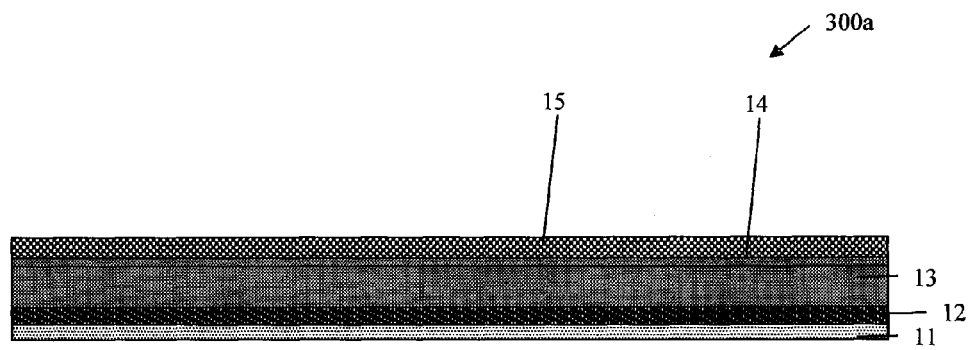
FIGS. 5A-5G schematically illustrate the formation of the enhancement mode GaN HEMT device according to the second embodiment of the present invention.

FIG. 5A illustrates the EPI structure 300a, including, from bottom to top, silicon substrate 11, buffer material 12, un-doped GaN buffer material 13, un-doped AlGaN barrier material 14, and the III-V gate compound material 15. The dimensions and compositions of the various materials are similar to that of the first embodiment.

Figure 5B:
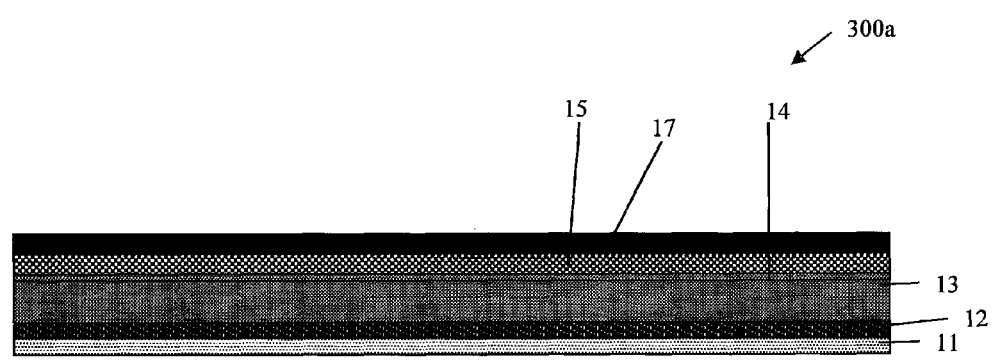

As shown in FIG. 5B, as in the first embodiment, gate metal 17 is deposited or grown on the EPI structure shown in FIG. 5A.

Subsequently, a single photo mask is used to pattern and etch the gate metal 17 and the III-V gate compound 15, resulting in the status and structure shown in FIG. 5C (after a photoresist strip is performed).

Figure 5C:
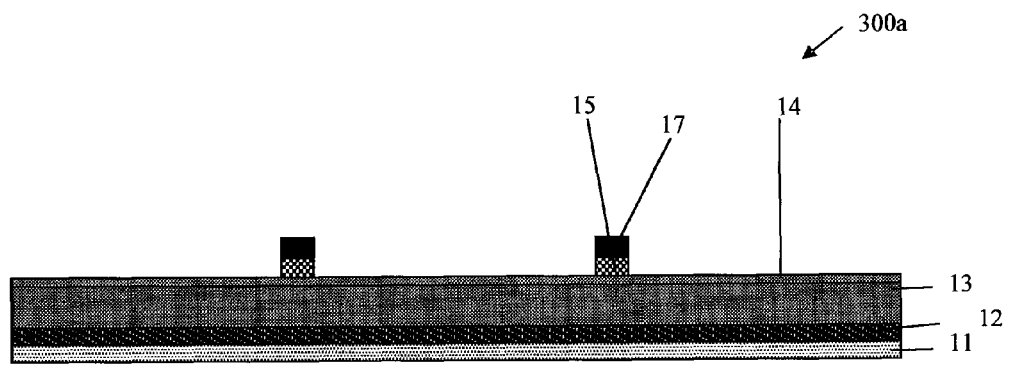
Figure 5D:
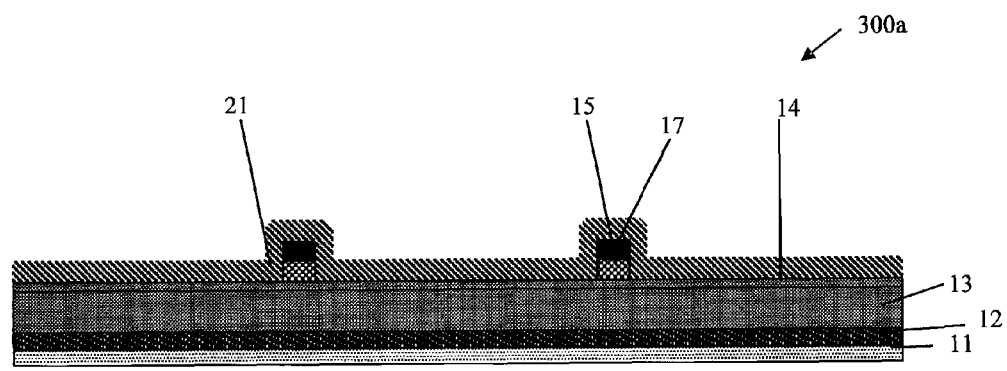

Referring to FIG. 5D, as before, a dielectric material 21 such as e.g., silicon oxide ($SiO_2$) is deposited over the FIG. 5C structure. After deposition of the dielectric material 21, an etch back process is performed to pattern and etch the dielectric material 21, resulting in spacers 21 on the sidewalls of the gate metal 17 and III-V gate compound 15 (shown in FIG. 5E).

Figure 5E:
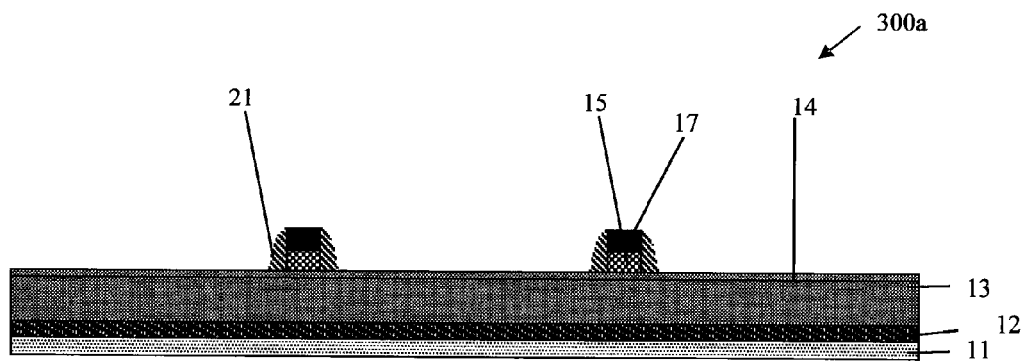

A dielectric material 18 such as e.g., si3N4 is then deposited over the FIG. 5E structure. After the deposition of the dielectric material 18, the material 18 is etched using a contact photo mask, followed by a photoresist strip, to form the structure illustrated in FIG. 5F.

Figure 5F:
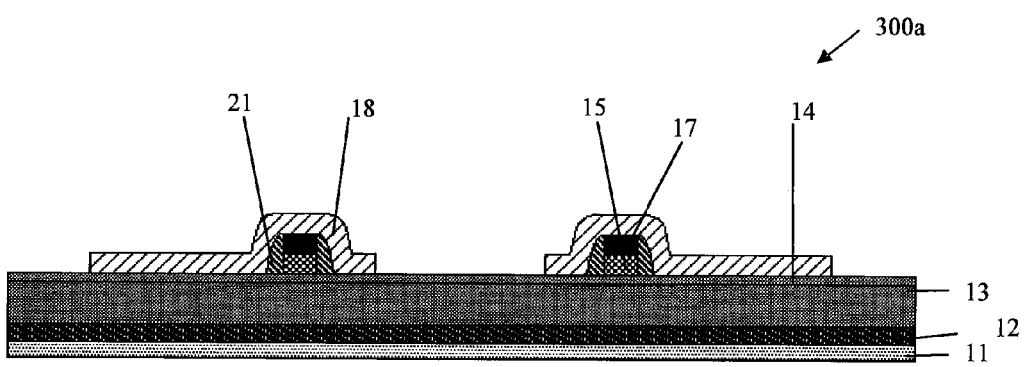
Figure 5G:
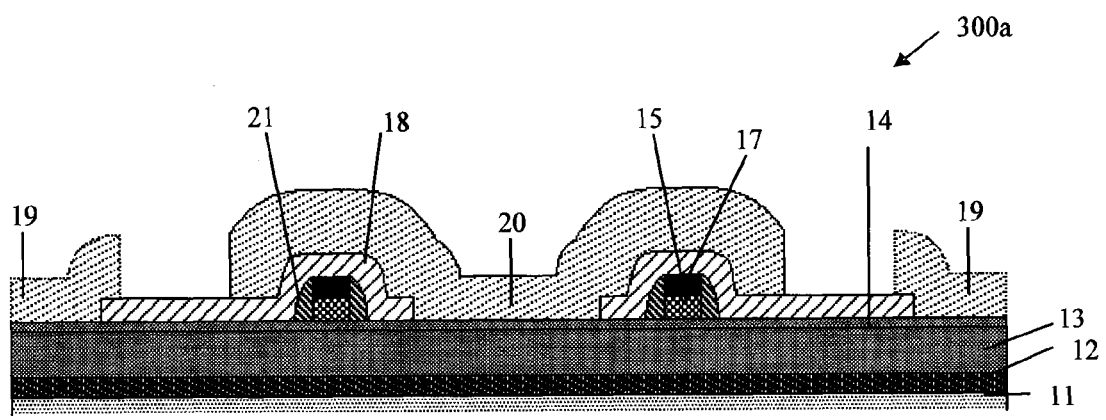

An ohmic contact metal is deposited over the FIG. 5F structure. Ohmic contact Metal can be made of titanium (Ti), aluminum (Al), and a capping metal stack. After the ohmic metal deposition, a metal mask is used to pattern and etch the ohmic contact metal, resulting in the drain ohmic contact 19 and the source ohmic contact 20, as shown in FIG. 5G. Rapid thermal anneal (RTA) is performed to form ohmic contacts to AlGaN/GaN 2DEG. The source ohmic contact metal 20 is provided over the gate and acts as a field plate. It reduces the electric field at the corner of the III-V gate compound 15 corner closest to the drain ohmic contact 19.

In accordance with the above-described method, the gate metal 17 and the III-V gate compound 15 are patterned and etched using a single photo mask and are thus self-aligned, with the same advantages as the first embodiment.

Figure 6:
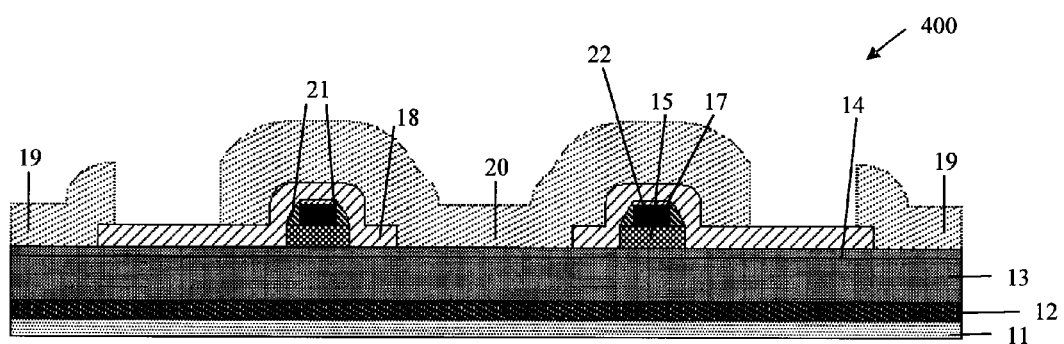
FIG. 6 illustrates an enhancement mode GaN HEMT device with a gate spacer formed according to a third embodiment of the present invention.

Referring now to FIGS. 6 and 7A-7H, a third embodiment of the present invention is now described. FIG. 6 illustrates an enhancement mode GaN HEMT device 400 formed by the method described below with respect to FIGS. 7A-7H, which has a gate metal 17 and III-V gate compound 15 that are self-aligned. Device 400 includes a silicon substrate 11, a buffer material 12, an un-doped GaN buffer material 13, an un-doped AlGaN barrier material 14, the III-V gate compound 15, the gate metal 17, a dielectric material 18, a drain ohmic contact 19, a source ohmic contact 20, a dielectric spacer 21 and a dielectric film 22. The source metal 20 also serves as a field plate that extends over the gate and toward the drain contact.

Figure 7A:
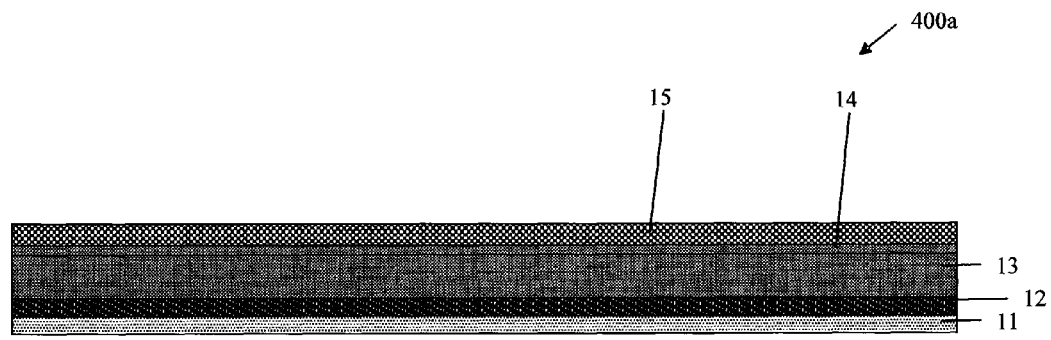
FIGS. 7A-7H schematically illustrate the formation of the enhancement mode GaN HEMT device according to the third embodiment of the present invention.

FIG. 7A illustrates the EPI structure of the GaN HEMT device 400a, including, from bottom up, the silicon substrate 11, buffer material 12, un-doped GaN buffer material 13, un-doped AlGaN barrier material 14, and the III-V gate compound material 15. The un-doped GaN buffer material 13 preferably has a thickness of about 0.5 to about 5 µm. The un-doped AlGaN barrier material 14 preferably has a thickness of about 50 Å to about 300 Å. The un-doped AlGaN barrier material 14 includes Al from about 12% to 28% of the metallic content of the AlGaN material. The III-V gate compound 15 may have a thickness of about 500 Å to about 2000 Å. Additionally, the III-V gate compound 15 may have a p-type doping concentration between about $10^{18}$ to about $10^{20}$ atoms per cm$^3$.

Figure 7B:
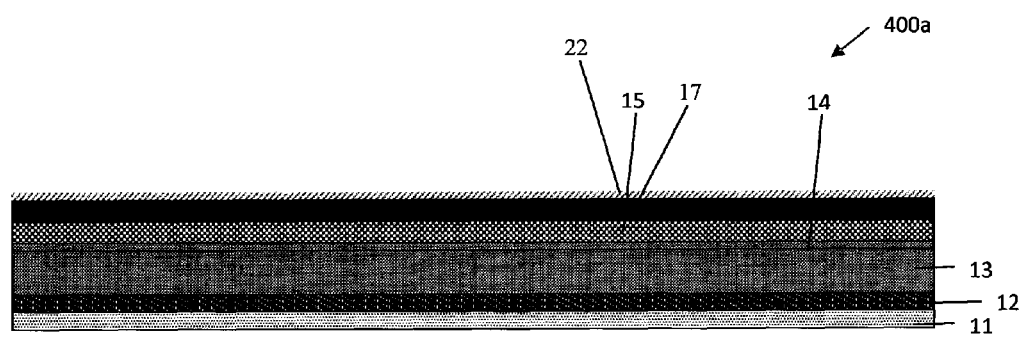

As shown in FIG. 7B, a gate metal 17 is deposited on the EPI structure shown in FIG. 7A. The gate metal 17, alternatively, can be grown at the end of EPI the above described growth. Gate metal 17 can be made of a refractory metal or its compound, e.g., tantalum (Ta), tantalum nitride (TaN), titanium nitride (TiN), palladium (Pd), tungsten (W), or tungsten silicide (WSi$_2$). A dielectric film 22 such as silicon oxide (SiO$_2$) is deposited or formed over the gate metal 17 by any known process.

Subsequently, a single photo mask is used to pattern and etch the gate metal 17 and dielectric film 22, resulting in stacks and the structure shown in FIG. 7C. The gate metal 17 and dielectric film 22 are etched by any known technique, e.g., plasma etching, followed by a photoresist strip.

Figure 7C:
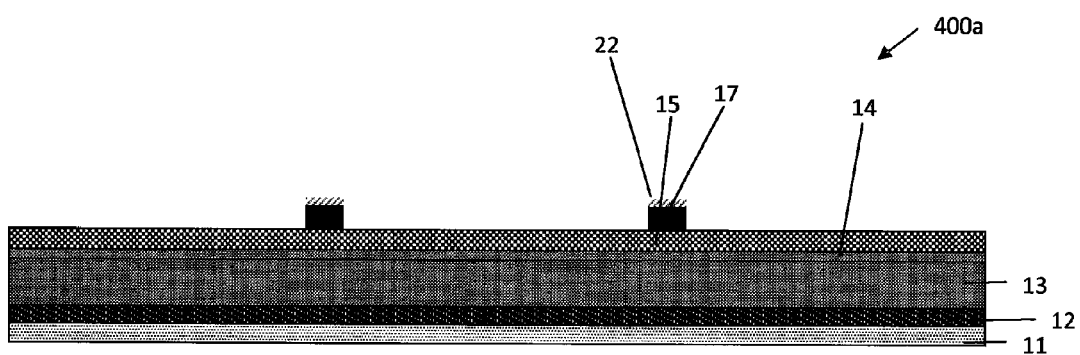
Figure 7D:
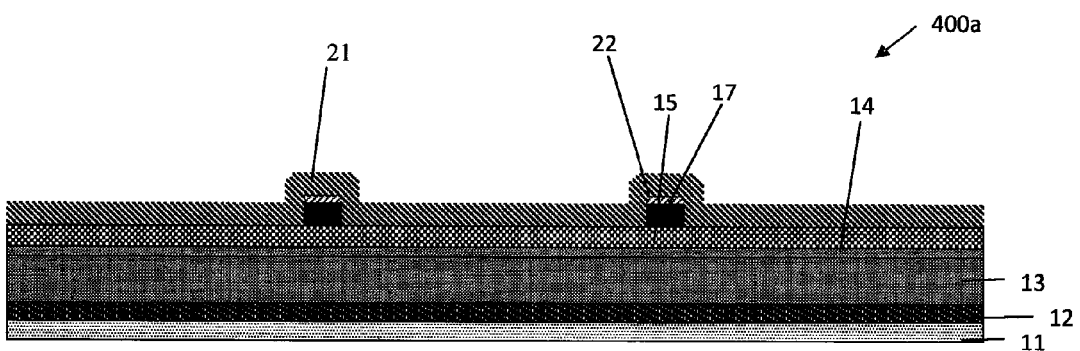
Figure 7E:
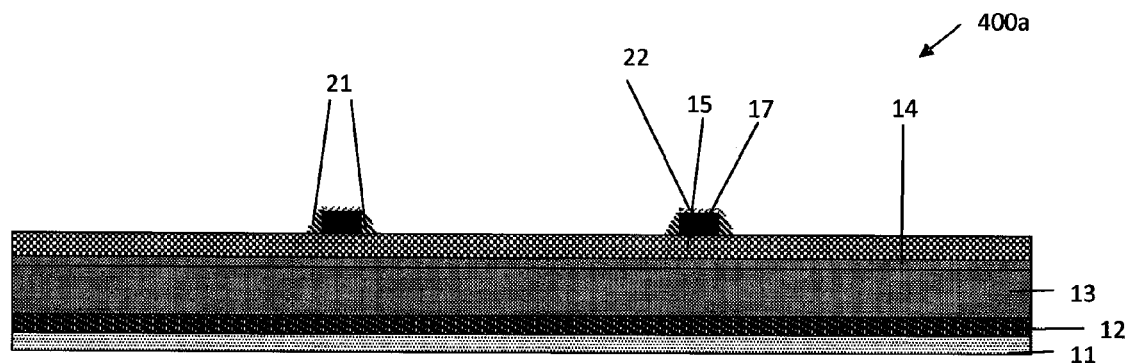

Referring now to FIG. 7D, dielectric material 21, such as silicon oxide (SiO$_2$) or plasma-enhanced chemical vapor deposition (PECVD) silicon nitride (Si3N4), is now deposited over the FIG. 7C structure. After deposition of the dielectric material 21, an etch back process is performed to pattern and etch the dielectric material 21, resulting in spacers 21 on the sidewalls of the gate metal 17 and dielectric film 22 (shown in FIG. 7E).

Figure 7F:
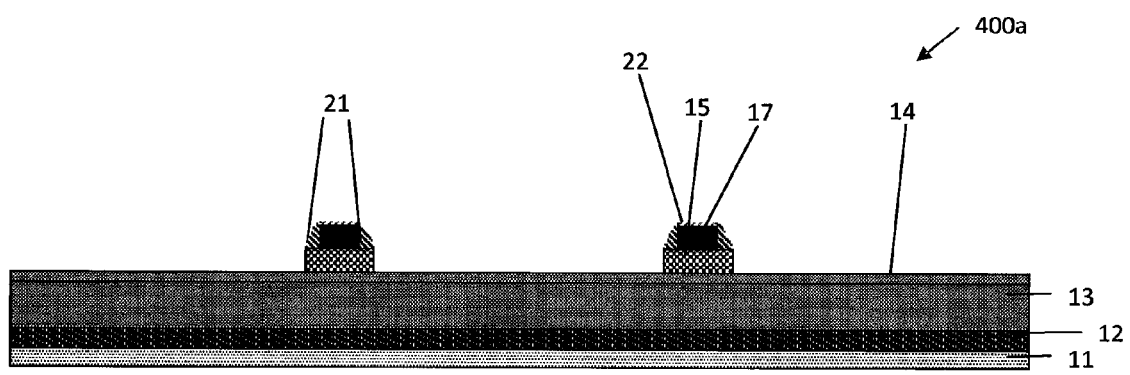

Referring now to FIG. 7F, etching of the III-V gate compound 15 is performed using the dielectric film 22 over the gate metal 17 and the spacers 21 as a hard mask. A dielectric material 18 such as e.g., si3N4 is then deposited over the FIG. 7F structure. After the deposition of the dielectric material 18, the material 18 is etched using a contact photo mask, followed by a photoresist strip, to form the structure illustrated in FIG. 7G.

Figure 7G:
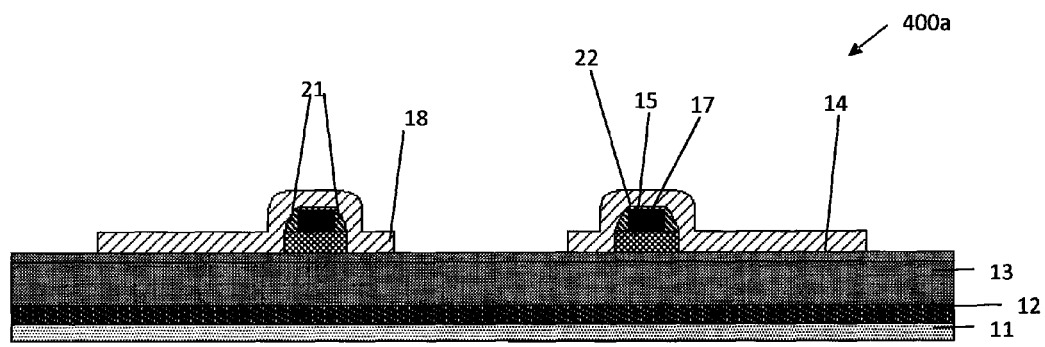
Figure 7H:
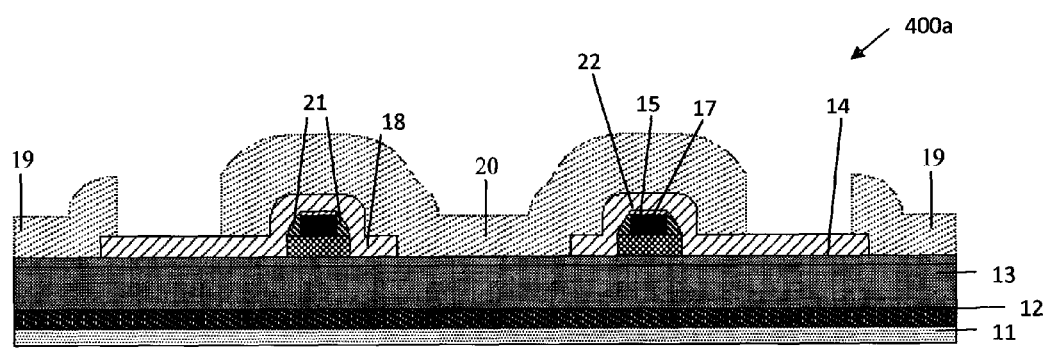

An ohmic contact metal is deposited over the FIG. 7G structure. Ohmic contact metal can be made of titanium (Ti), aluminum (Al), and a capping metal stack. After the ohmic metal deposition, a metal mask is used to pattern and etch the ohmic contact metal, resulting in the drain ohmic contact 19 and the source ohmic contact 20, as shown in FIG. 7H. Rapid thermal anneal (RTA) is performed to form ohmic contacts to AlGaN/GaN 2DEG. The source ohmic contact metal 20 is provided over the gate and acts as a field plate. It reduces the electric field at the corner of the III-V gate compound 15 corner closest to the drain ohmic contact 19.

Figure 8:
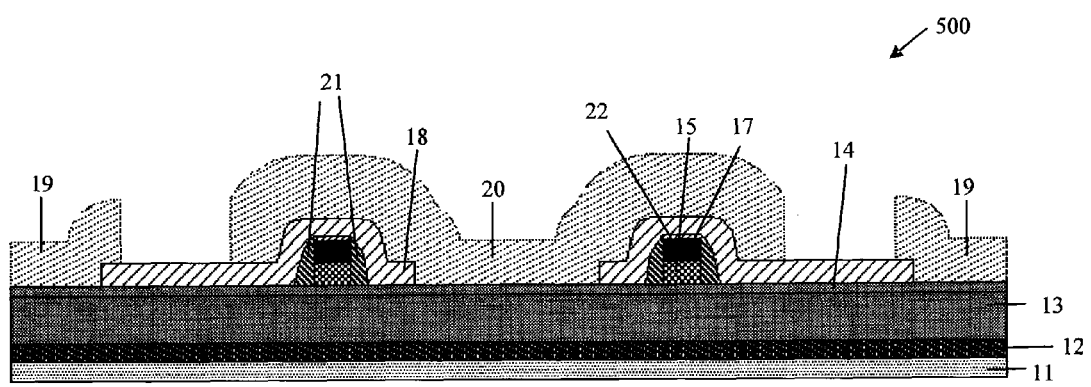
FIG. 8 illustrates an enhancement mode GaN HEMT device with a gate spacer formed according to a fourth embodiment of the present invention.

Referring now to FIGS. 8 and 9A-9G, a fourth embodiment of the present invention is now described. FIG. 8 illustrates an enhancement mode GaN HEMT device 500 having a gate spacer 21 formed by the method shown in FIGS. 9A-9G. The resulting device 500 will have a gate metal 17 and III-V gate compound 15 that are self-aligned. Device 500 differs from device 400 of FIG. 6 in that device 500 includes spacers 21 that are formed not only on the sidewalls of the gate metal 17 and dielectric film 22, but also on the sidewalls of the III-V gate compound 15.

Figure 9A:
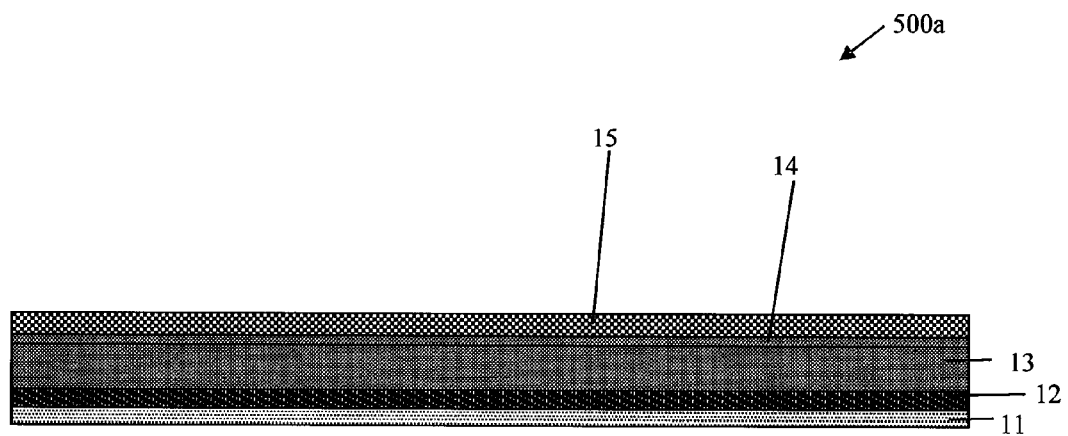
FIGS. 9A-9G schematically illustrate the formation of the enhancement mode GaN HEMT device according to the fourth embodiment of the present invention.

FIG. 9A illustrates the EPI structure 500a, including, from bottom to top, silicon substrate 11, buffer material 12, un-doped GaN buffer material 13, un-doped AlGaN barrier material 14, and the III-V gate compound material 15. The dimensions and compositions of the various materials are similar to that of the third embodiment described above.

Figure 9B:
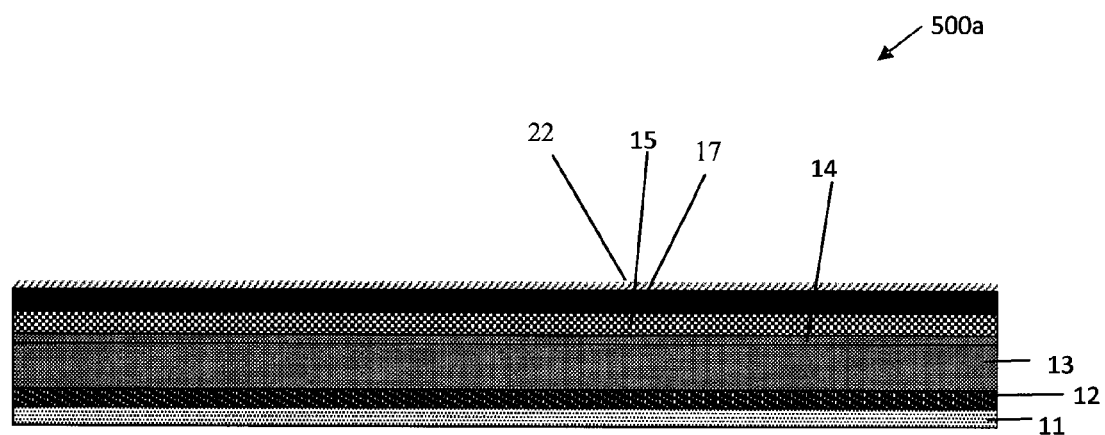

As shown in FIG. 9B, as in the third embodiment, gate metal 17 is deposited or grown on the EPI structure shown in FIG. 9A and then a dielectric film 22 (e.g., SiO2) is formed over the gate metal 17.

Subsequently, a single photo mask is used to pattern and etch the dielectric film 22, gate metal 17 and the III-V gate compound 15, resulting in the status and structure shown in FIG. 9C (after a photoresist strip is performed).

Figure 9C:
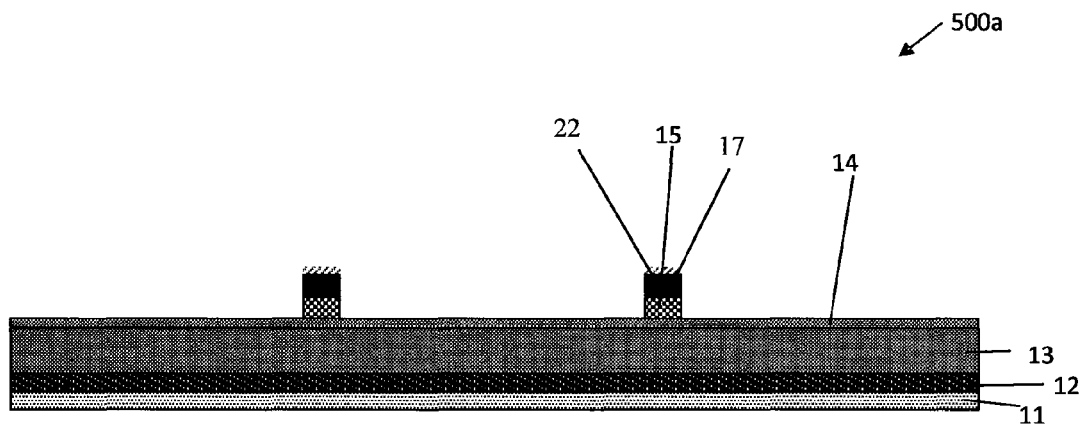
Figure 9D:
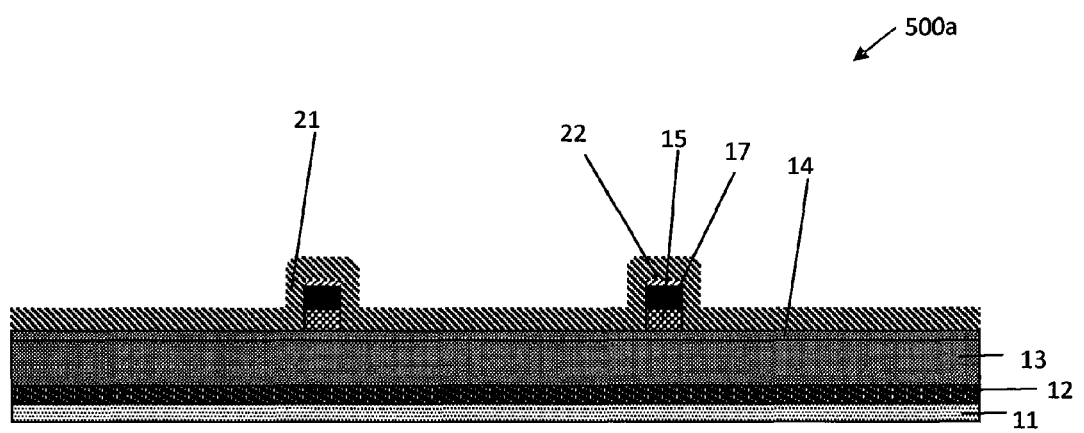

Referring to FIG. 9D, similar to the third embodiment, a dielectric material 21 such as e.g., silicon oxide (SiO$_2$) or plasma-enhanced chemical vapor deposition (PECVD) silicon nitride (Si3N4) is deposited over the FIG. 9C structure. After deposition of the dielectric material 21, an etch back process is performed to pattern and etch the dielectric material 21, resulting in spacers 21 on the sidewalls of the dielectric film 22, gate metal 17 and III-V gate compound 15 (shown in FIG. 9E).

Figure 9E:
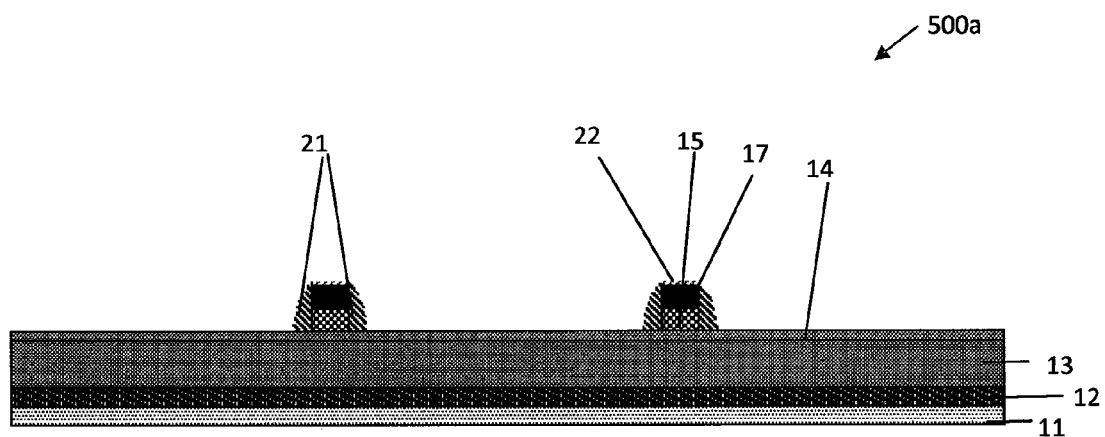

A dielectric material 18 such as e.g., si3N4 is then deposited over the FIG. 9E structure. After the deposition of the dielectric material 18, the material 18 is etched using a contact photo mask, followed by a photoresist strip, to form the structure illustrated in FIG. 9F.

Figure 9F:
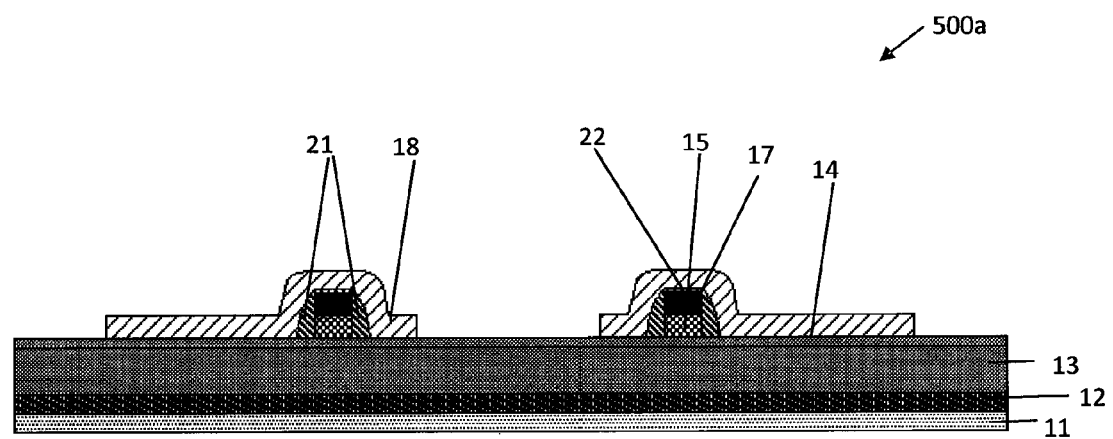
Figure 9G:
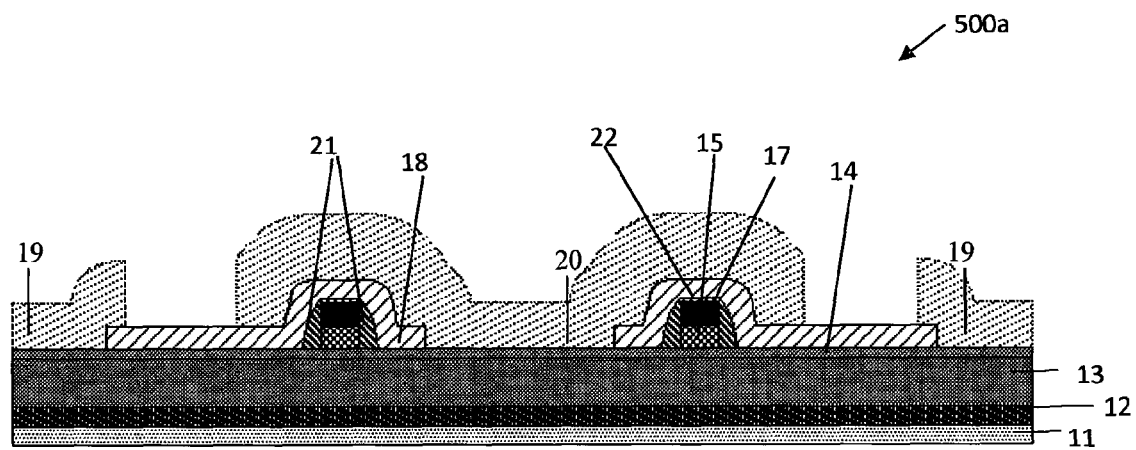

An ohmic contact metal is deposited over the FIG. 9F structure. Ohmic contact metal can be made of titanium (Ti), aluminum (Al), and a capping metal stack. After the ohmic metal deposition, a metal mask is used to pattern and etch the ohmic contact metal, resulting in the drain ohmic contact 19 and the source ohmic contact 20, as shown in FIG. 9G. Rapid thermal anneal (RTA) is performed to form ohmic contacts to AlGaN/GaN 2DEG. The source ohmic contact metal 20 is provided over the gate and acts as a field plate. It reduces the electric field at the corner of the III-V gate compound 15 corner closest to the drain ohmic contact 19.

In accordance with the above-described method, the gate metal 17 and the III-V gate compound 15 are patterned and etched using a single photo mask and are thus self-aligned, with the same advantages as the first through third embodiments.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

The invention claimed is:

1. An enhancement-mode GaN transistor comprising:
   a substrate;
   buffer material over the substrate;
   barrier material over the buffer material;
   a gate III-V compound over the barrier material;
   a gate metal formed on a first portion of an upper surface of the gate III-V compound; and
   spacer material formed on a second portion of the upper surface of the gate III-V compound and on sidewalls of the gate metal.

2. The transistor of claim 1, wherein the gate III-V compound and the gate metal are formed with a single photo mask process to be self-aligned.

3. The transistor of claim 1, wherein the buffer material comprises GaN.

4. The transistor of claim 1, wherein the barrier material comprises AlGaN.

5. The transistor of claim 1, wherein the spacer material is formed on sidewalls of the gate metal and gate III-V compound.

6. An enhancement-mode GaN transistor comprising:
   a substrate;
   buffer material over the substrate;
   barrier material over the buffer material;
   a gate III-V compound over the barrier material;
   a gate metal over the gate III-V compound;
   a dielectric material over the gate metal; and
   spacer material formed at least on sidewalls of the gate metal.

7. The transistor of claim 6, wherein the spacer material is also formed on sidewalls of the dielectric material.

8. The transistor of claim 6, wherein the spacer material is formed on sidewalls of the gate metal, gate III-V compound and dielectric material.

9. The transistor of claim 1, wherein the spacer material comprises silicon oxide (SiO2).

10. The transistor of claim 1, wherein the spacer material comprises silicon nitride ($Si_3N_4$).

11. The transistor of claim 1, wherein the gate metal contains one or more refractory metals, metallic compounds and alloys selected from the group consisting of Ta, TaN, TiN, Pd, W, or WSi.

* * * * *